United States Patent [19]

Johns

[11] Patent Number: 5,825,189
[45] Date of Patent: Oct. 20, 1998

[54] METHOD OF LOCATING THE POSITION OF A FAULT ON A POWER TRANSMISSION

[75] Inventor: Allan Thomas Johns, Swindon, United Kingdom

[73] Assignee: GEC Alsthom Limited, Warwickshire, United Kingdom

[21] Appl. No.: 696,115

[22] Filed: Aug. 13, 1996

Related U.S. Application Data

[63] Continuation of Ser. No. 373,371, Jan. 17, 1995, abandoned.

[30] Foreign Application Priority Data

Jan. 26, 1994 [GB] United Kingdom .................. 9401467

[51] Int. Cl.$^6$ .................................................. G01R 31/08
[52] U.S. Cl. .......................... 324/525; 364/481; 364/492
[58] Field of Search ................................. 324/522, 509; 364/483; 361/42, 44

[56] References Cited

U.S. PATENT DOCUMENTS

| | | | |
|---|---|---|---|
| 4,314,199 | 2/1982 | Yamaura et al. ........................... | 324/52 |
| 4,559,491 | 12/1985 | Saha ........................................ | 324/522 |
| 4,767,996 | 8/1988 | Jinzenji .................................... | 324/522 |
| 4,785,249 | 11/1988 | Yoshida .................................... | 324/522 |
| 4,797,805 | 1/1989 | Nimmersjo ............................... | 324/522 |
| 4,800,509 | 1/1989 | Nimmersjo ............................... | 324/509 |
| 4,803,635 | 2/1989 | Andow ..................................... | 324/522 |
| 5,399,974 | 3/1995 | Eriksson et al. .......................... | 324/509 |
| 5,485,394 | 1/1996 | Murata et al. ............................ | 364/483 |

FOREIGN PATENT DOCUMENTS

| | | | |
|---|---|---|---|
| 0106790 | 4/1984 | European Pat. Off. ............... | 324/522 |
| 0 578 123 A2 | 1/1994 | European Pat. Off. . | |
| 0 578 123 A3 | 1/1994 | European Pat. Off. . | |
| 0040746 | 3/1977 | Japan ..................................... | 324/522 |
| 0168976 | 10/1983 | Japan ..................................... | 324/522 |
| 4050672 | 6/1990 | Japan . | |
| 40-5072251 | 3/1993 | Japan ..................................... | 324/522 |
| 2 036 478 | 6/1980 | United Kingdom . | |

OTHER PUBLICATIONS

Erickson, "An Accurate Fault Locator . . . ", IEEE Trans. on PAS, V. 104, No. 2, pp. 424–436, Feb. 1985.

IEEE Computer Applications In Power, vol. 6, No. 3, Jul. 1993 US, pp. 22–26, N. N. Bengiamin, et al., *PC–Based Fault Finer*.

IEEE Transactions On Power Apparatus and Systems, vol. 101, No. 8, Aug. 1982 US, pp. 2892–2898, T. Takagi, et al., *Development of a new Fault Locator using the One–Terminal Voltage and Current Data*.

IEE Proceedings C, vol. 136, No. 5, Sep. 1989, pp. 279–288, C. Christopoulos, et al., *Signal processing and discriminating technique incorporated in a protective scheme based on traveling waves*.

ABB Review, No. 8, Aug. 1994 CH, pp. 20–27, D. Novosel, et al., *Optimal fault location for transmission systems*.

Connor, F.R., *Networks*, Edward Arnold Pub. Ltd., 41 Bedford Sq., London, WC1B3DQ, pp. 100–101, 1979.

*Primary Examiner*—Vinh P. Nguyen
*Assistant Examiner*—Thomas Valone
*Attorney, Agent, or Firm*—Kirschstein, et al.

[57] ABSTRACT

A method of locating the position of a fault on a power transmission line between first and second ends of the line is performed by calculating the complex fault impedance at each of a plurality of assumed fault positions along the length of the line, the fault impedance at each assumed position being calculated utilizing the measurement before and after fault occurrence of the voltage and current at the first end of the line, parameters of the line, and the impedance at the second end of the line; and selecting as the actual fault position the assumed fault position of the plurality of assumed fault positions for which the argument of the complex fault impedance most closely equals zero. The method may be used with single or multi-phase power transmission lines. There is also disclosed a method of determining the form of impedance network at a fault on a multi-phase power transmission line.

5 Claims, 9 Drawing Sheets

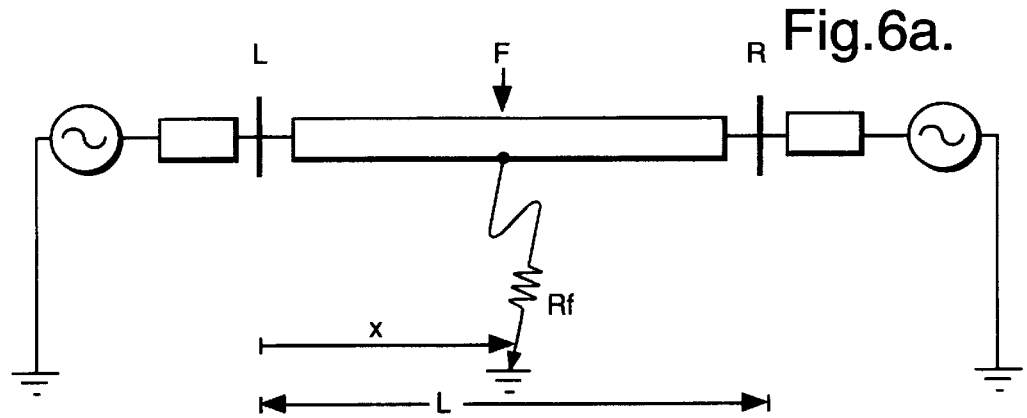
Fig.6a.
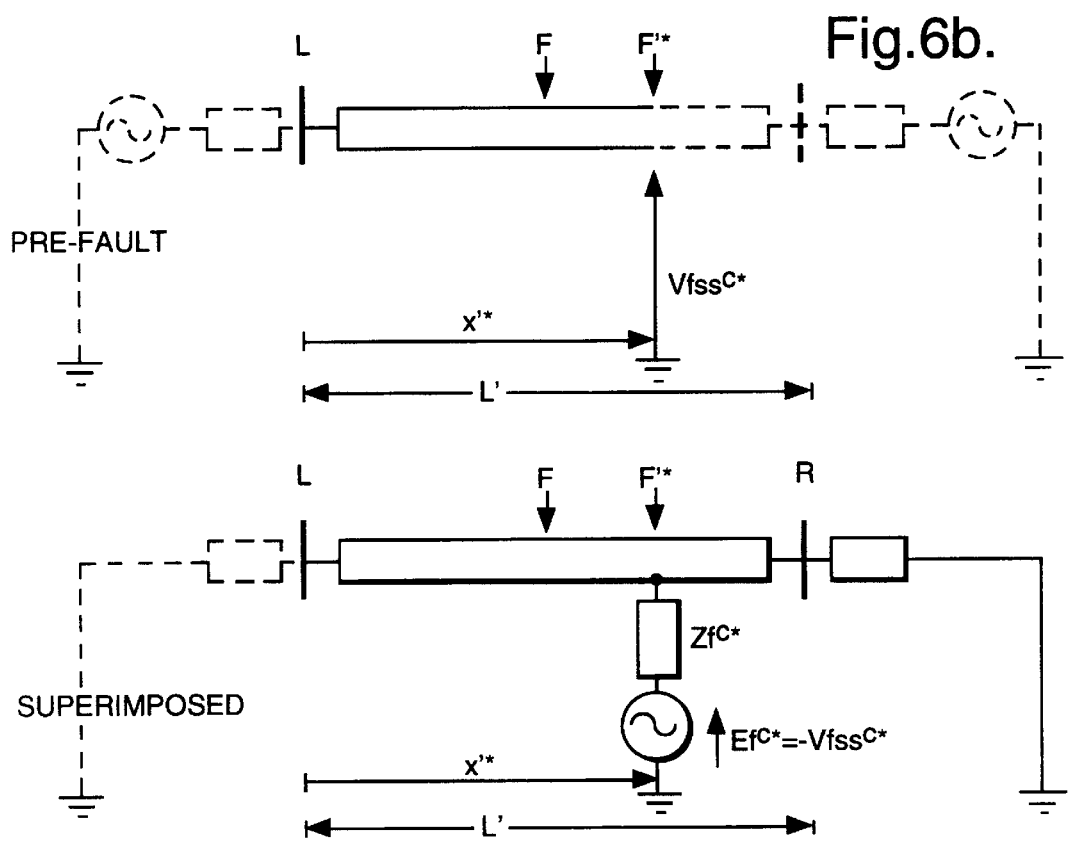
Fig.6b.
Fig.6c.

FAULT TYPE=(b-c; c-e)

i) CORRECTLY ASSUMED CASE:
FAULT TYPE = (b-c; c-e)

ii) INCORRECTLY ASSUMED CASE:
FAULT TYPE = (b-e; c-e)

i) CORRECTLY ASSUMED CASE:
FAULT TYPE = (b-c; c-e)

SAME ii) INCORRECTLY ASSUMED CASE:
FAULT TYPE = (b-e; c-e)

DISCREPANCY

METHOD OF LOCATING THE POSITION OF A FAULT ON A POWER TRANSMISSION

A continuation under 37 CFR 1.62, of pending prior application Ser. No. 08/373,371, filed Jan. 17, 1995, now abandoned.

BACKGROUND OF THE INVENTION

This invention relates to a method of locating the position of a fault on a power transmission line, be it a single or multi-phase line. In another aspect the invention relates to a method of determining the form of impedance network at a fault on a multi-phase power transmission line.

It is important that a method of locating the position of a fault on a power transmission line provides an accurate estimate of the distance to the fault. Accuracy is required so that the fault can be located quickly and repairs begun. Hence the power is cut off for less time and less revenue lost to the power utility.

At present, fault location methods providing the required accuracy require measurements to be made at both ends, as opposed to only one end, of the line, and communicated to a single location. Such methods are more complicated, and hence more expensive, to implement than those that require measurements to be made at only one end.

It is an object of the present invention to provide a method of locating the position of a fault on a power transmission line which provides an accurate estimate of the distance to the fault yet requires measurements to be made at only one end of the line.

According to a first aspect of the present invention there is provided a method of locating the position of a fault on a power transmission line between first and second ends of the line comprising: calculating the complex fault impedance at each of a plurality of assumed fault positions along the length of the line, the fault impedance at each assumed position being calculated utilising the measurement before and after fault occurrence of the voltage and current at said first end of the line, parameters of the line, and the assumed impedance at said second end of the line; and selecting as the actual fault position the assumed fault position of said plurality of assumed fault positions for which the argument of the complex fault impedance most closely equals zero.

In one particular method according to the first aspect of the present invention where said power transmission line is a multi-phase power transmission line: said step of calculating the complex fault impedance is carried out in respect of each complex impedance of each of a plurality of forms of fault network assumed to be at each of said plurality of assumed fault positions, each complex impedance of each network at each position being calculated utilising the measurement before and after fault occurrence in respect of each phase of the line of the voltage and current at said first end of the line, parameters of the line, and the assumed impedance at said second end of the line; said method further comprises the step of analysing the variation of each complex impedance of each assumed fault network over said plurality of assumed fault positions to determine the assumed fault network for which the argument of each complex impedance most closely equals zero at the same assumed fault position of the plurality of assumed fault positions; and said step of selecting as the actual fault position comprises selecting as the actual fault position that same assumed fault position.

According to a second aspect of the present invention there is provided a method of determining the form of impedance network at a fault on a multi-phase power transmission line between first and second ends of the line comprising: calculating the complex impedances of each of a plurality of assumed forms of fault impedance network at each of a plurality of assumed fault positions along the length of the line, each complex impedance of each network at each position being calculated utilizing the measurement before and after fault occurrence in respect of each phase of the line of the voltage and current at said first end of the line, parameters of the line, and the assumed impedance at said second end of the line; analysing the variation of each complex impedance of each assumed fault network over said plurality of assumed fault positions to determine the assumed fault network for which the argument of each complex impedance most closely equals zero at the same assumed fault position of the plurality of assumed fault positions; and selecting as the form of the actual fault impedance network the form of that determined assumed fault network.

BRIEF DESCRIPTION OF THE DRAWINGS

The invention will now be further explained, and methods in accordance with the first and second aspects of the invention described, by way of example, with reference to the accompanying drawings in which:

FIGS. 5 and 6 illustrate a method in accordance with the first aspect of the invention;

DETAILED DESCRIPTION OF THE PREFERRED EMBODIMENT

The following symbols are used in the explanation and description.

L—Local-end busbar
R—Remote-end busbar
F—Fault point
EL—Local-end generator driving voltage (phasor) [V]
ER—Remote-end generator driving voltage (phasor) [V]
ZsL—Local-end source impedance (phasor) [ohm]
ZsR—Remote-end source impedance (phasor) [ohm]
Ipre—Pre-fault current at local-end busbar (phasor) [A]
Vpre—Pre-fault voltage at local-end busbar (phasor) [V]
Ipost—Post-fault current at local-end busbar (phasor) [A]
Vpost—Post-fault voltage at local-end busbar (phasor) [V]
I—Superimposed current at local-end busbar (phasor) [A]

V—Superimposed voltage at local-end busbar (phasor) [V]

L—Total line length [km]

ZL—Line impedance per unit length (phasor) [ohm/km]

x—Distance to fault from local-end busbar [km]

Rf—Fault resistance [ohm]

Zf—Fault impedance (phasor) [ohm]

Vfss—Pre-fault voltage at fault point (phasor) [V]

Ef—Superimposed back injecting fault point generator driving voltage (phasor) [V]

The following conventions are used in the explanation and description.

$\#^m$—Measured value $\#^i$—Assumed value $\#^c$—Calculated value $\#^?$—Unknown value $\#^*$—Changing value m—Measured value '—Assumed value c—Calculated value ?—Unknown value

*—Changing value

Figure 1:
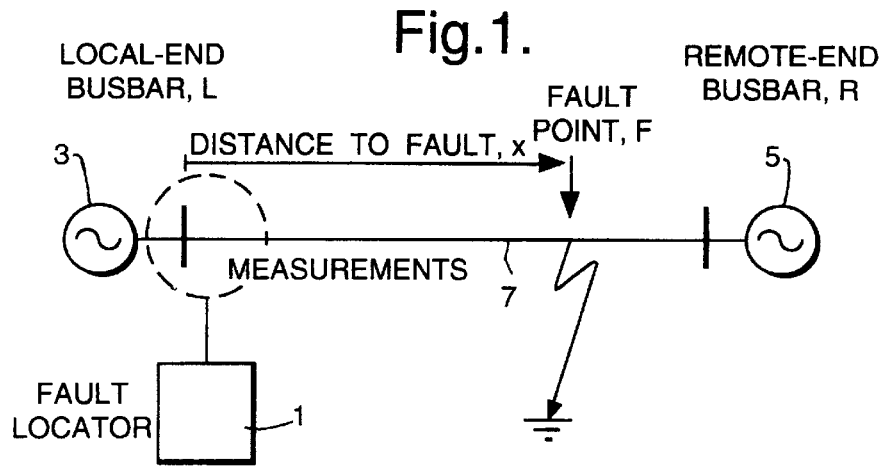
FIG. 1 illustrates single-ended fault location on a single-circuit double-end fed power network.

Referring to FIG. 1, measurements are made at the local-end busbar L only and supplied to fault locator 1. Generators 3, 5 feed the local- and remote-ends respectively of the single-circuit power network 7.

Figure 2A:
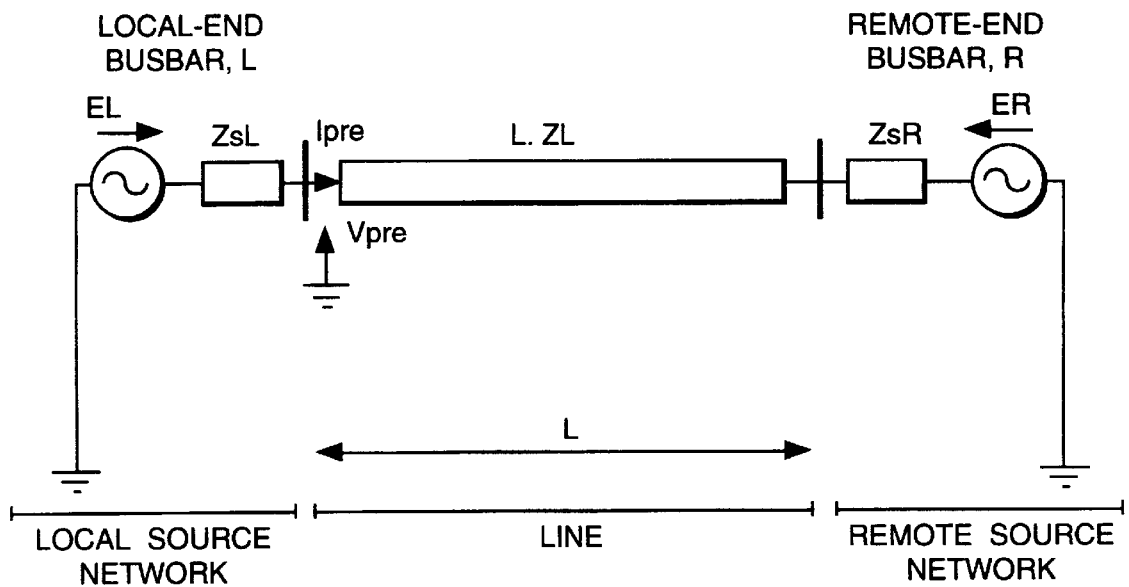
FIG. 2 illustrates overall unfaulted and faulted system models for a single-phase single-circuit double-end fed network.

A single-phase single-circuit double-end fed network of the form shown in FIG. 2a) is taken as the overall unfaulted system model. The source networks, at the local- and remote-ends, are represented by their thevenin equivalents and the line is represented by a lumped parameter model. Applying a resistive fault to the FIG. 2a) system at some distance, x from the local-end busbar, a faulted system model as shown in FIG. 2b) is achieved.

Figure 2B:
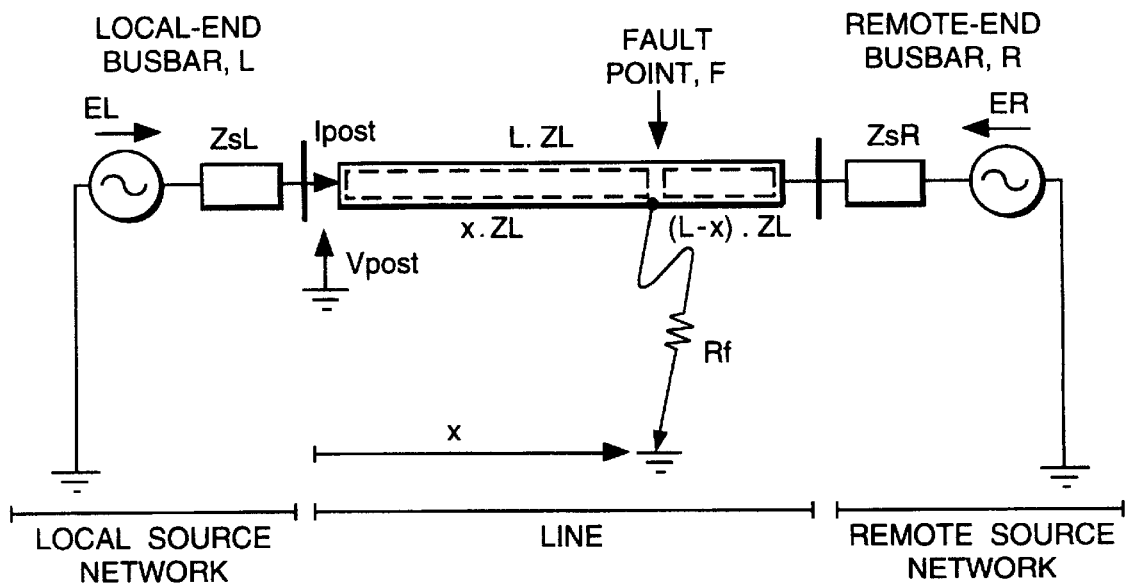

Using the law of superposition in linear network theory, the FIG. 2b) faulted system model can be analysed by decomposing it into two component circuits: pre-fault and superimposed. This decomposition will now be explained.

Figure 3A:
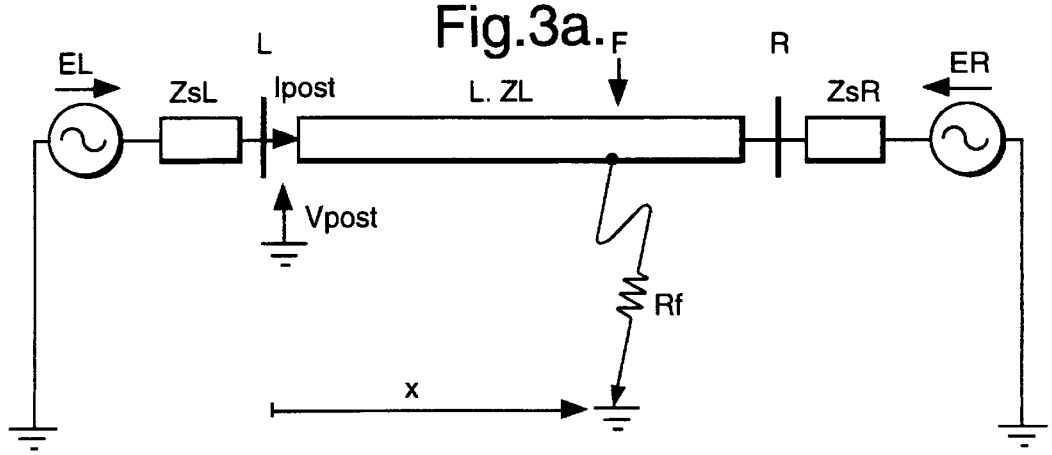
FIG. 3 illustrates an analysis of the faulted system model of FIG. 2 by decomposition into pre-fault and superimposed component circuits.
Figure 3B:
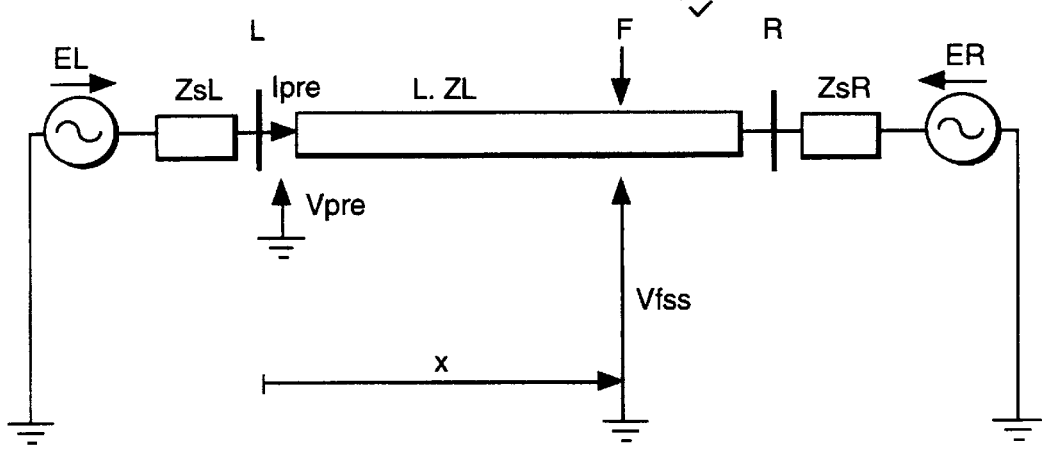

A faulted system model, as shown in FIG. 3a), can be decomposed into two component circuits: pre-fault and superimposed, as shown in FIGS. 3b) and 3c). This process of decomposition is shown again, but in an alternative and more detailed form, in FIG. 8. Note that the following new symbols have been introduced.

Vf—Superimposed fault point voltage (phasor) [V]

If—Fault current (phasor) [I]

Efss—Pre-fault injecting fault point generator driving voltage (phasor) [V]

Ifss—Pre-fault fault current (phasor) [I]

Figure 8A:
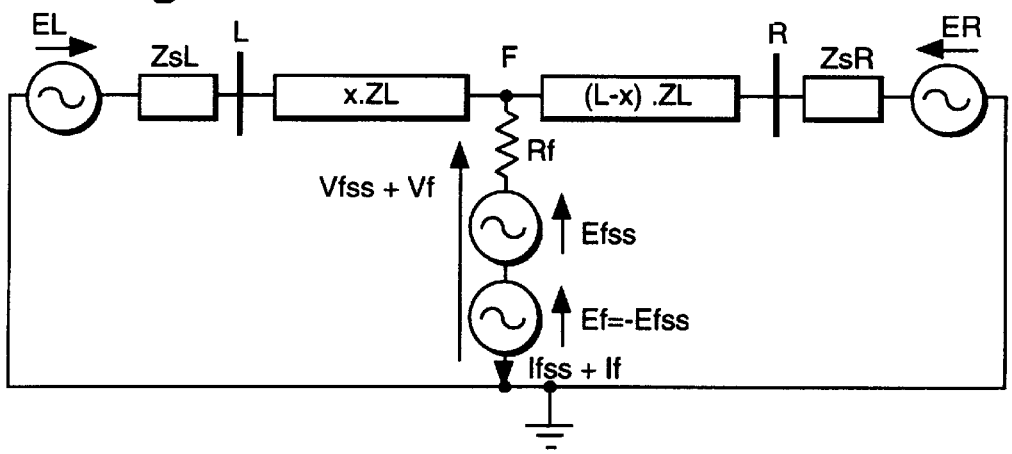
FIG. 8 illustrates in more detail that illustrated in FIG. 3.
Figure 8B:
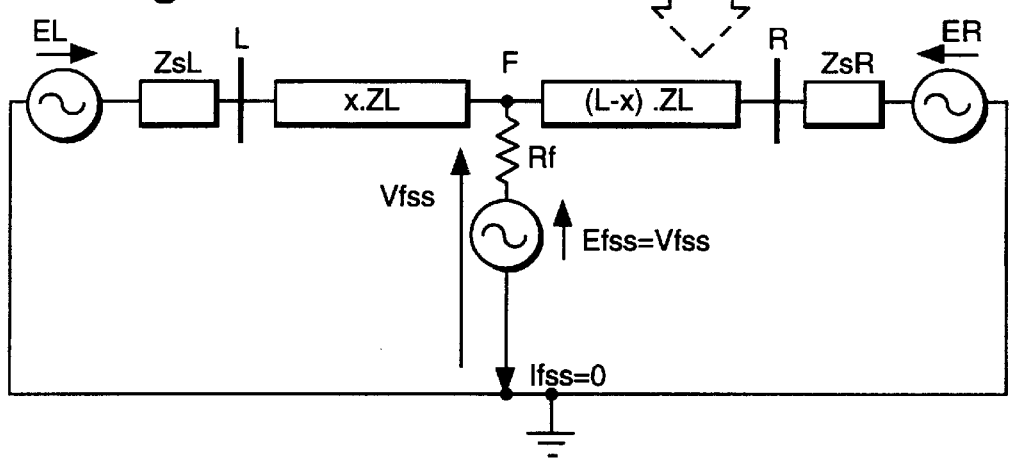
Figure 8C:
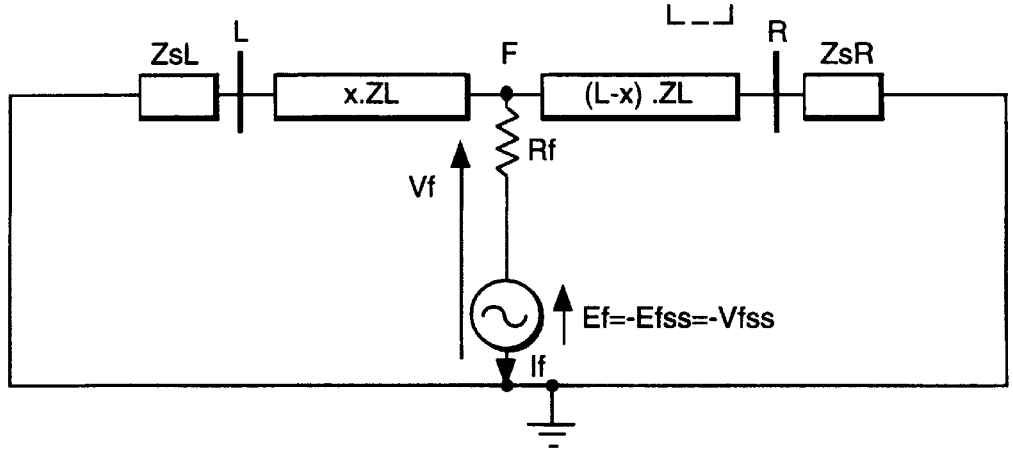

Looking at the decomposition of the faulted system model shown in FIG. 8, the following points can be made:

(i) The faulted system model (or post-fault circuit) contains two driving voltage sources in the faulted leg on the ground side of the fault resistance. Since, after the fault the ground side of the fault resistance is at zero potential, these driving voltage sources must have equal and opposite driving potentials.

(ii) Applying the superposition theorem, the faulted system model can be seen to decompose easily into the pre-fault and superimposed component circuits shown. One of the fault point driving sources is associated with the pre-fault component circuit and regarded as the pre-fault injecting fault point generator driving voltage, Efss. The other fault point driving source is associated with the superimposed component circuit and regarded as the superimposed injecting fault point generator driving voltage, Ef.

(iii) The pre-fault component circuit represents the situation before the fault occurred. Since before the fault there is an open circuit to ground at the fault point, the pre-fault fault current, Ifss equals zero and the pre-fault injecting fault point generator driving voltage, Efss will equal the pre-fault voltage at the fault point, Vfss.

(iv) The superimposed component circuit represents the 'fault-caused component' which is superimposed upon the pre-fault circuit.

(v) Based upon what has been said above, it can be seen that the superimposed injecting fault point generator driving voltage, Ef is equal and opposite to the pre-fault voltage at the fault point, Vfss, the former being renamed the superimposed back injecting fault point generator driving voltage.

Figure 3C:
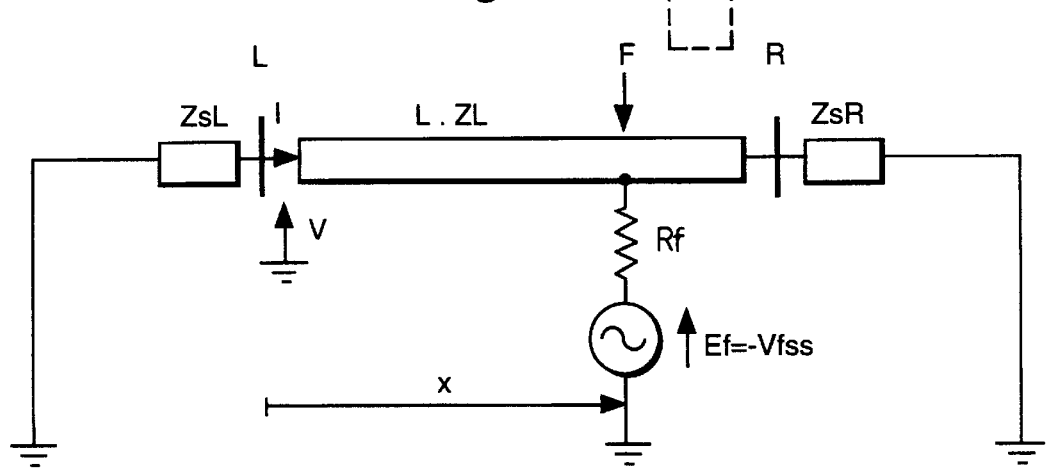

Thus, the decomposition of the faulted system model, as shown in FIG. 3, can be understood.

Viewing a faulted network in terms of its pre-fault and superimposed component circuits is known in single-ended fault location, see, for example, Takagi, Yamakoshi, Yamauara, Kondow, and Matsushima, "Development of a new type fault locator using one-terminal voltage and current data", IEEE Trans., PAS-101, Aug. 1982, pp. 2892–2898. Note that the use of these component circuits has the advantage of taking into account the pre-fault loading and also eliminating the need to know the precise nature of the local-end network.

Having arrived at the pre-fault and superimposed circuits shown in FIG. 3, values are inserted as follows. The pre-fault circuit is forced with the measured values for the pre-fault current at local-end busbar, Ipre, and the pre-fault voltage at local-end busbar, Vpre. The superimposed circuit is forced with values, derived from measured values, for the superimposed current at local-end busbar, I (=Ipost−Ipre), and the superimposed voltage at local-end busbar, V (=Vpost−Vpre), where Ipost is the post-fault current measured at local-end busbar, and Vpost is the post-fault voltage measured at local-end busbar. Here the pre-fault and post-fault current and voltages are the steady-state power-frequency voltage and current phasors, measured at the local-end busbar in the actual system before and after the fault, as illustrated in FIG. 2.

Values for the following pre-fault and superimposed circuit parameters are assumed: total line length, L, line impedance per unit length, ZL, and remote-end source impedance, ZsR. Note that the method of fault location to be described below is insensitive to likely inaccuracies in the foregoing assumed values.

Figure 4A:
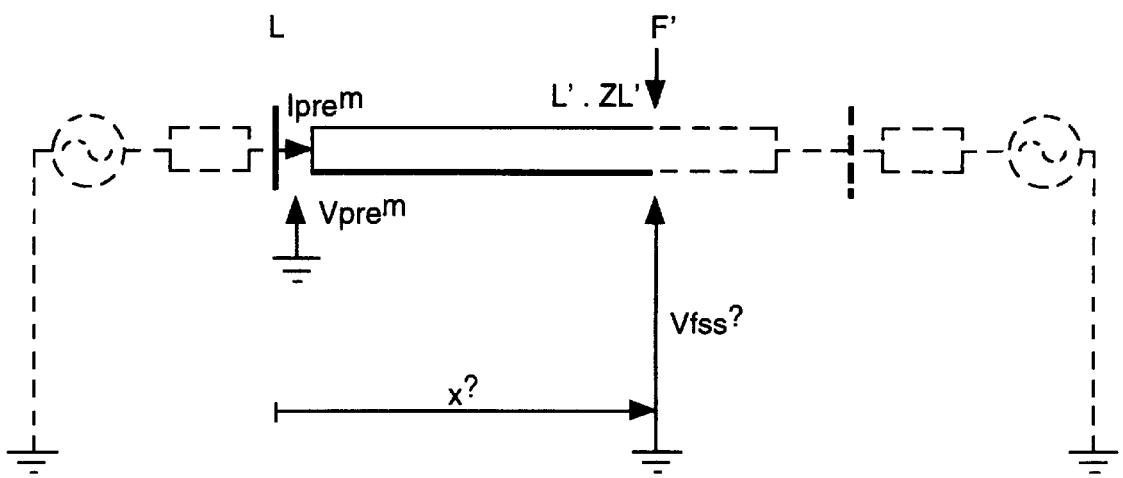
FIG. 4 illustrates measured, assumed and unknown values in the pre-fault and superimposed circuits of FIG. 3.
Figure 4B:
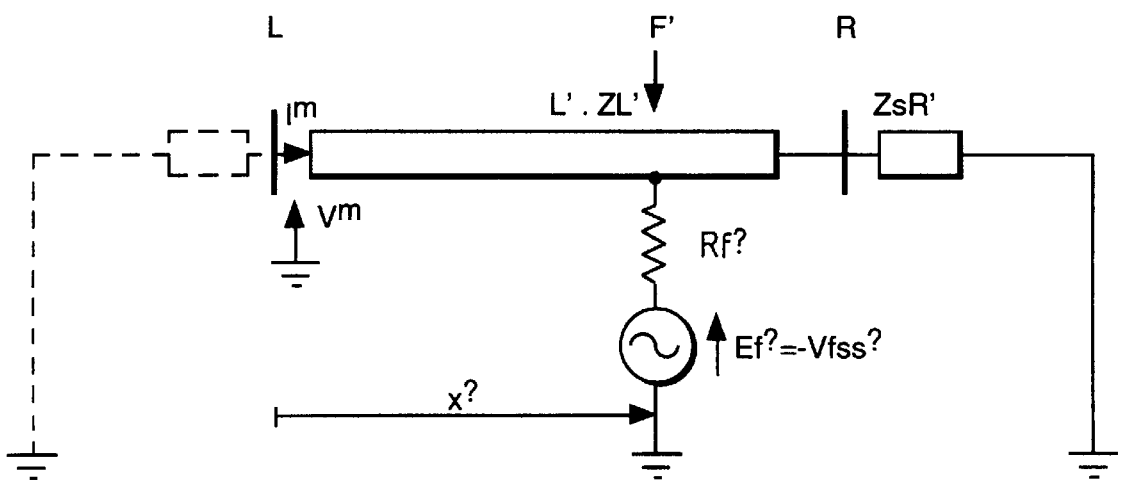

The following values remain as unknown: pre-fault voltage at fault point, Vfss (hence superimposed back injecting fault point generator driving voltage, Ef which equals and is opposite to Vfss), fault resistance, Rf, and distance to fault from local-end busbar, x. Hence, we have arrived at the situation summarised in FIG. 4. Here the circuit values measured, assumed and remaining unknown are shown.

To this point nothing novel has been described. However, from this point forth a new direction is taken to those taken previously.

Figure 5A:
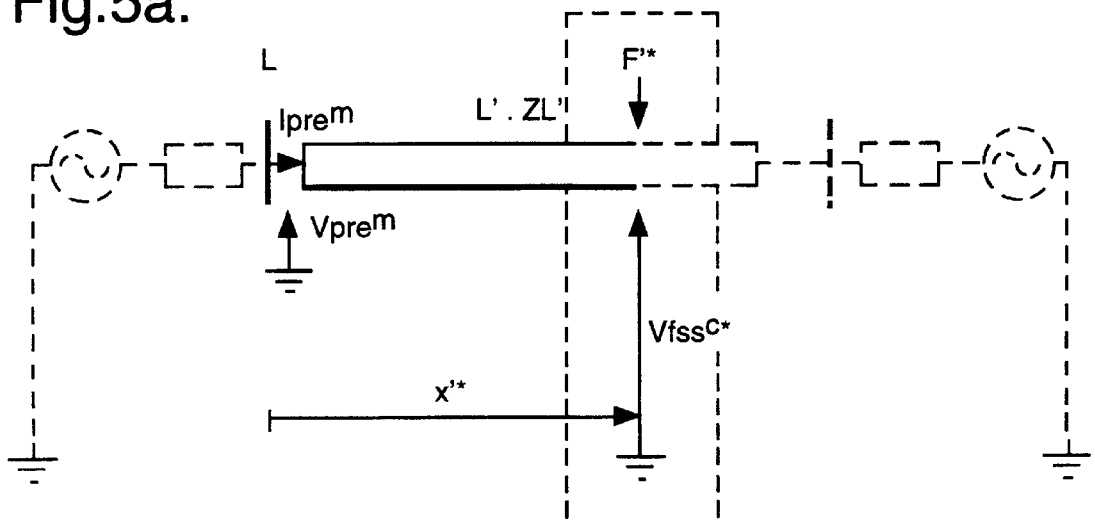
Figure 5B:
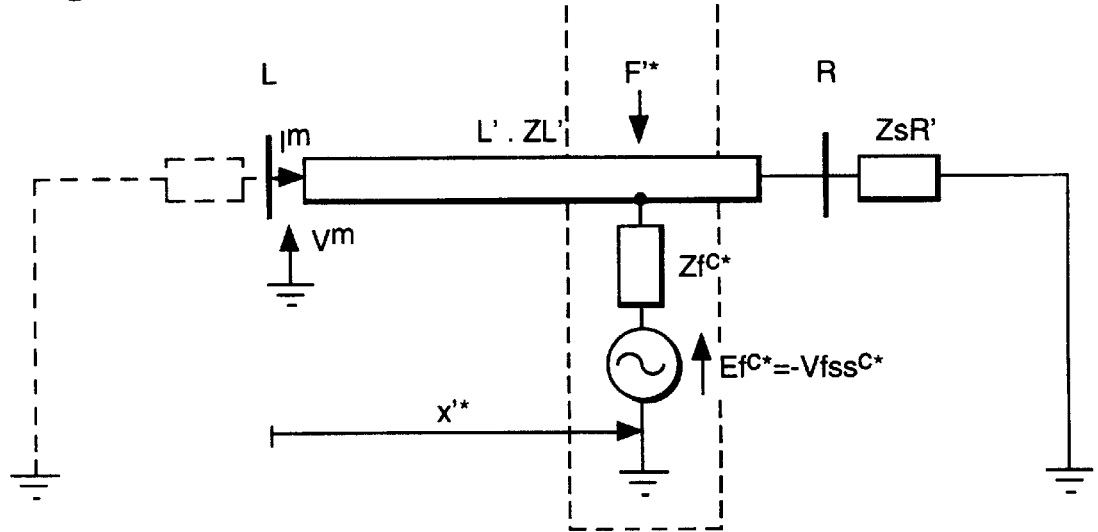
Figure 7A:
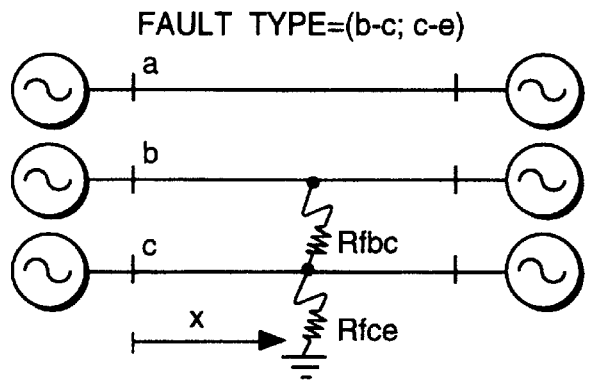
FIG. 7 illustrates methods in accordance with the first and second aspects of the invention.
Figure 7B:
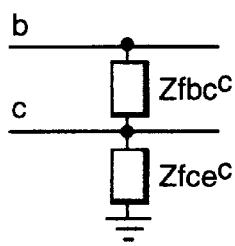
Figure 7B:
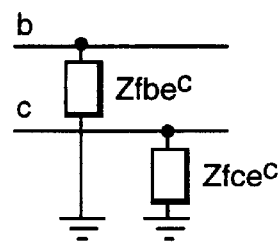
Figure 7C:
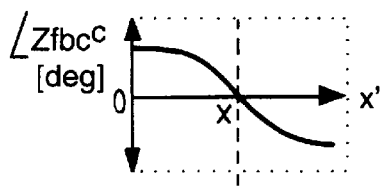
Figure 7C:
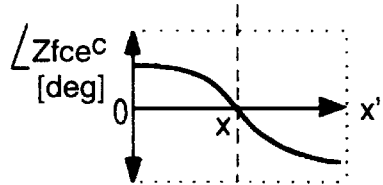
Figure 7C:
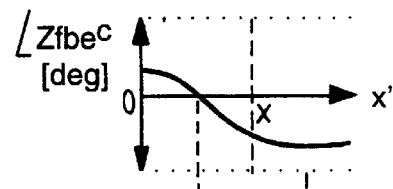
Figure 7C:
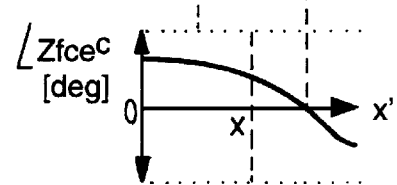

The unknown fault resistance, Rf, in the superimposed circuit is replaced with a fault impedance, Zf. The fault position is assumed at different positions, F', along the entire line length. That is the fault distance, x', is assumed for a range of values from zero up to the total line length, L. For each assumed fault position, the fault impedance, Zf, is calculated. The foregoing is summarised in FIG. 5.

The fault impedance Zf is calculated using steady-state analytical techniques as will now be explained.

Figure 9A:
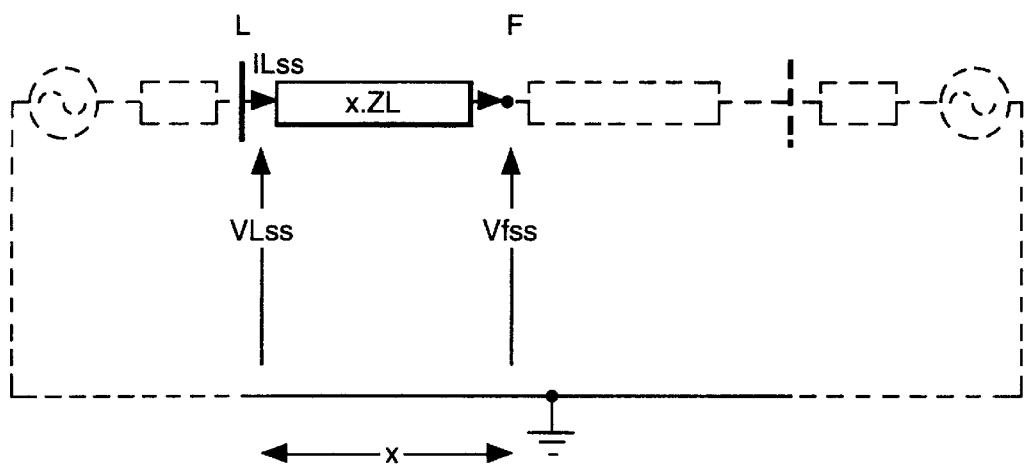
FIGS. 9 and 10 illustrate respectively circuits and the two-port representations thereof used in the calculation of fault impedance as occurs in the methods according to the first and second aspects of the invention.

The pre-fault and superimposed circuits used to calculate the fault impedance Zf are shown in FIGS. 9 and 10. The former shows the actual circuits and the latter the equivalent two-port representation. The calculation of the fault impedance Zf involves calculating the fault current If, the superimposed fault point voltage Vf, the pre-fault fault point voltage Vfss and the superimposed back injecting fault point generator driving voltage Ef. The calculation of these values and the subsequent calculation of the fault impedance Zf is as follows.

In the calculation the following new symbols are used.

ILss—Pre-fault current at local-end busbar (phasor) [A] (previously referred to as Ipre)

VLss—Pre-fault voltage at local-end busbar (phasor) [V] (previously referred to as Vpre)

IL—Superimposed current at local-end busbar (phasor) [A] (previously referred to as I)

VL—Superimposed voltage at local-end busbar (phasor) [V] (previously referred to as V)

IR—Superimposed current at remote-end busbar (phasor) [A]

VR—Superimposed voltage at remote-end busbar (phasor) [V]

IfL—Current fed into fault from local-end source (phasor) [A]

IfR—Current fed into fault from remote-end source (phasor) [A]

Ax—Four parameters describing the two-port network
Bx representing the transmission line
Cx to the left of the fault
Dx (phasor values)

Ay—Four parameters describing the two-port network
By representing the transmission line
Cy to the right of the fault
Dy (phasor values)

y—Distance to fault from remote-end busbar [km]

The A, B, C, D parameters mentioned above are commonly defined as described in: "Networks" by F. R. Connor, published by Edward Arnold, London, 1979, pages 100–101, namely that in a two-port network having an input voltage $V_1$, an input current $I_1$, an output voltage $V_2$ and an output current $I_2$, then:

$V_1 = AV_2 - BI_2$
$I_1 = CV_2 - DI_2$
where
$A = V_1/V_2(I_2=0)$
$B = -V_1/I_2(V_2=0)$
$C = I_1/V_2(I_2=0)$
$D = -I_1/I_2(V_1=0)$.

To derive the fault current If only the superimposed circuit is required. Considering the two-port representation of the superimposed circuit shown in FIG. 10b) and applying two-port network theory we can obtain the following equations:

For the transmission line to the left of the fault:

$$Vf = Ax \cdot VL - Bx \cdot IL \qquad (1)$$

$$IfL = -[Cx \cdot VL] + Dx \cdot IL$$

$$IfL = -[Cx \cdot VL - Dx \cdot IL] \qquad (2)$$

Where for the simple transmission line circuit being employed here,

Ax=1
Bx=x.ZL
Cx=0
Dx=1

For the transmission line to the right of the fault:

$$Vf = Ay \cdot VR + By \cdot [-IR] \quad Vf = Ay \cdot VR - By \cdot IR \qquad (3)$$

$$-IfR = Cy \cdot VR + Dy \cdot [-IR] \quad IfR = -[Cy \cdot VR] + Dy \cdot IR \qquad (4)$$

Where
Ay=1
By=y.ZL
Cy=0
Dy=1
and
y=L−x

Figure 9B:
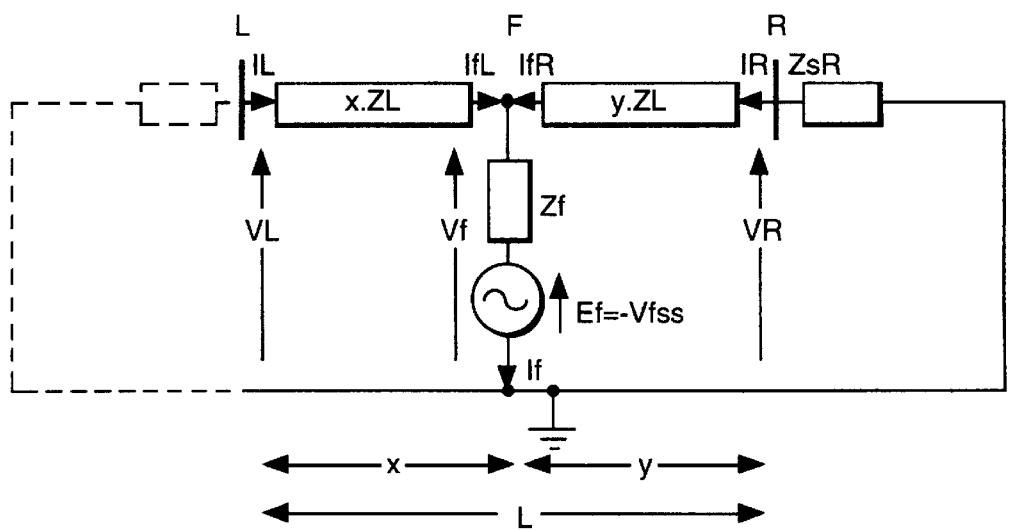
Figure 10A:
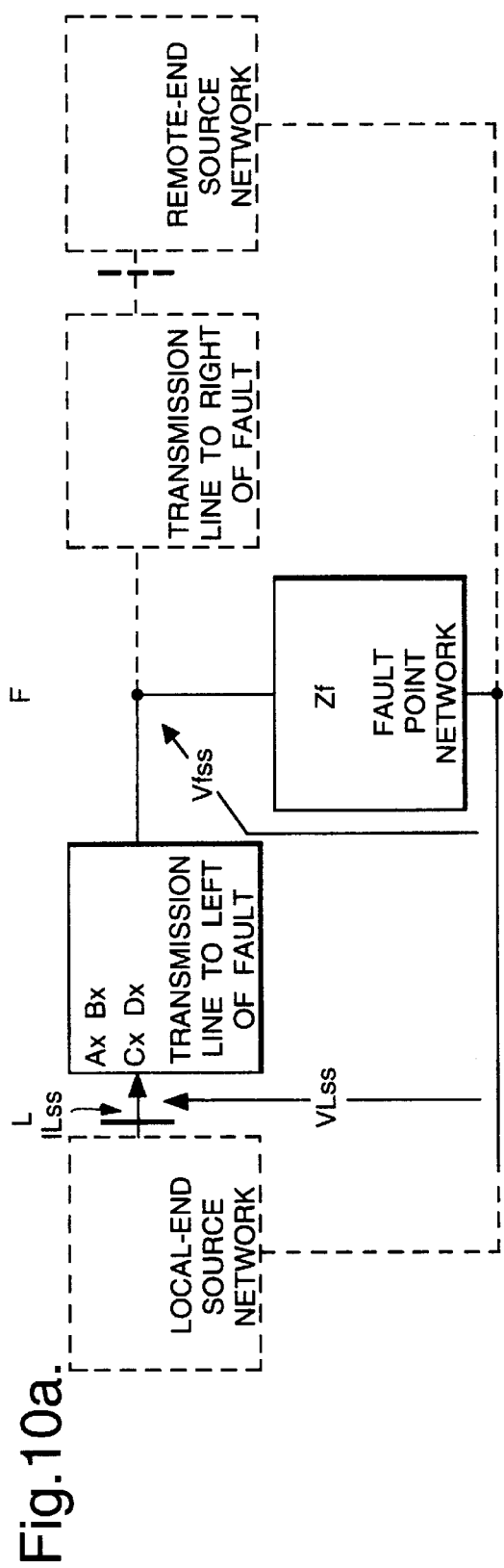
Figure 10B:
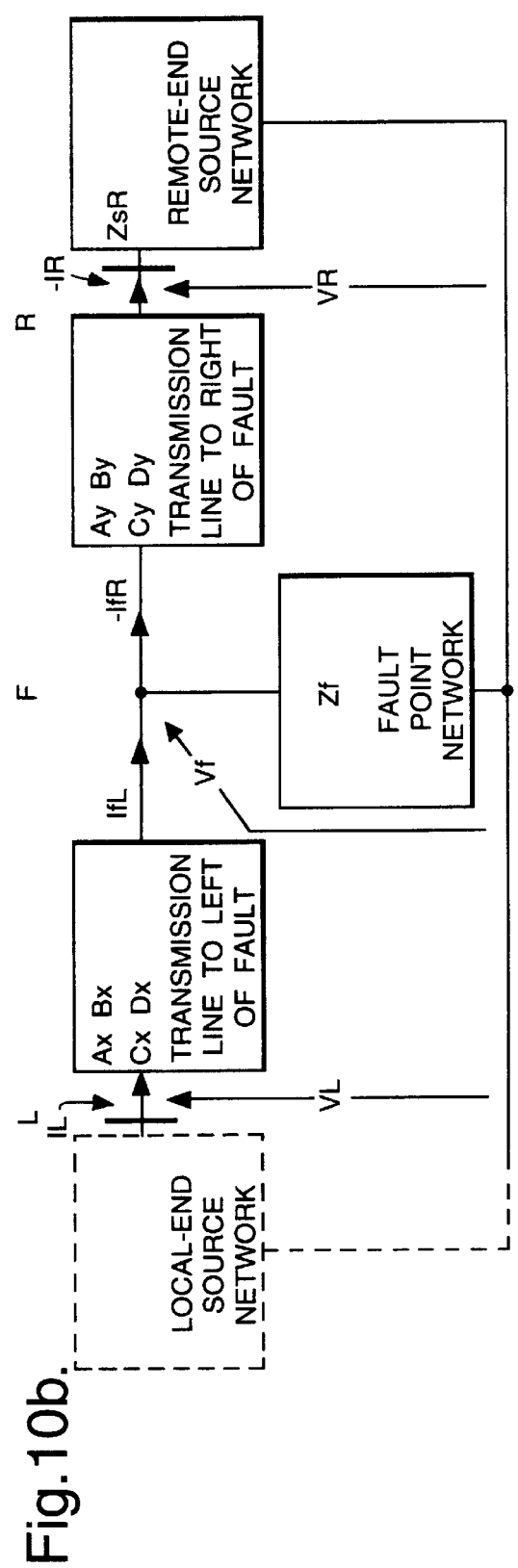

Considering the superimposed circuit in FIG. 9b) the following equation can be obtained for the remote-end source network:

$$VR = -ZsR \cdot IR \qquad (5)$$

Further, from the superimposed model in FIG. 9b) it can be seen that $$If = IfL + IfR \qquad (6)$$

Combining equations (2) and (4) according to equation (6):

$$If = -[Cx \cdot VL - Dx \cdot IL] - Cy \cdot VR + Dy \cdot IR$$

$$If = -Cx \cdot VL + Dx \cdot IL - Cy \cdot VR + Dy \cdot IR \qquad (7)$$

Equating equations (1) and (3)

$$Ax \cdot VL - Bx \cdot IL = Ay \cdot VR - By \cdot IR \qquad (8)$$

Substituting (5) into (8)

$$Ax \cdot VL - Bx \cdot IL = Ay \cdot [-ZsR \cdot IR] - By \cdot IR \quad Ax \cdot VL - Bx \cdot IL = -[Ay \cdot ZsR + By] \cdot IR$$
$$IR = -[Ay \cdot ZsR + By]^{-1} \cdot [Ax \cdot VL - Bx \cdot IL] \qquad (9)$$

Substituting (5) into (7)

$$If = -Cx \cdot VL + Dx \cdot IL - Cy \cdot [-ZsR \cdot IR] + Dy \cdot IR \quad If = -Cx \cdot VL + Dx \cdot IL + [Cy \cdot ZsR + Dy] \cdot IR \qquad (10)$$

Substituting (9) into (10)

$$If = -Cx \cdot VL + Dx \cdot IL + [Cy \cdot ZsR + Dy] \cdot \{-[Ay \cdot ZsR + By]^{-1} \cdot [Ax \cdot VL - Bx \cdot IL]\}$$

$$If = -Cx \cdot VL + Dx \cdot IL - [Cy \cdot ZsR + Dy] \cdot [Ay \cdot ZsR + By]^{-1} \cdot [Ax \cdot VL - Bx \cdot IL]$$

$$If = -Cx \cdot VL - [Cy \cdot ZsR + Dy] \cdot [Ay \cdot ZsR + By]^{-1} \cdot [Ax \cdot VL] + Dx \cdot IL - [Cy \cdot ZsR + Dy] \cdot [Ay \cdot ZsR + By]^{-1} \cdot [-Bx \cdot IL]$$

$$If = -\{Cx + [Cy \cdot ZsR + Dy] \cdot [Ay \cdot ZsR + By]^{-1} \cdot Ax\} \cdot VL + \{Dx + [Cy \cdot ZsR + Dy] \cdot$$

$$[Ay \cdot ZsR+By]^{-1} \cdot Bx\} \cdot IL$$

Letting functions, $$M=-\{Cx+[Cy \cdot ZsR+Dy][Ay \cdot ZsR+By]^{-1} \cdot Ax\}$$

$$N=Dx+[Cy \cdot ZsR+Dy][Ay \cdot ZsR+By]^{-1} \cdot Bx$$

Hence, the final equation for fault current, If is $$If=M \cdot VL+N \cdot IL \qquad (11)$$

Where
M=−{Cx+[Cy.ZsR+Dy].[Ay.ZsR+By]$^{-1}$.Ax}
N=Dx+[Cy.ZsR+Dy].[Ay.ZsR+By]$^{-}$.Bx
Ax=1
Bx=x.ZL
Cx=0
Dx=1
Ay=1
By=y.ZL
Cy=0
Dy=1
y=L−x The superimposed fault point voltage Vf is found using equation (1) already derived and reshown below:

$$Vf=Ax \cdot VL-Bx \cdot IL \qquad (12)$$

Where
Ax=1
Bx=x.ZL
Cx=0
Dx=1

The pre-fault fault point voltage Vfss is found using the pre-fault circuit shown in FIG. 9a). Considering the two-port representation of the pre-fault circuit in FIG. 10a) and applying two-port network theory we can obtain the following equation:

$$Vfss=Ax.VLss-Bx.ILss \qquad (13)$$

Where
Ax=1
Bx=x.ZL
Cx=0
Dx=1

According to the theory on which these pre-fault and superimposed circuits are based, the superimposed back injecting fault point generator driving voltage Ef is equal and opposite to the pre-fault fault point voltage Vfss. Hence $$Ef=-Vfss \qquad (14)$$

Looking at the superimposed circuit in FIG. 9b), the fault impedance Zf is given by the equation:

$$Zf=(Vf-Ef)/If \qquad (15)$$

The equations for the terms contained within the above equation for Zf have already been derived. These are equations (11) to (14) which together with equation (15) enable the fault impedance Zf to be calculated.

Having calculated the fault impedance Zf for a range of assumed fault distances x', the actual fault distance x is identified as that assumed fault distance for which the argument of Zf equals (or tends towards) zero. This is based on the tested observation that only when the assumed fault position F' is at the actual fault position F does the calculated fault impedance Zf become a purely real (resistive) value. The complete method, as given here, is summarised in FIG. 6.

In a practical system there is more than one phase involved, typically there are three phases. In the case of a multi-phase system the method is the same as has been applied in the single-phase case, with the exception that the single fault impedance to be calculated has become a network of inter-phase and phase-to-earth fault impedances. Any one of these fault impedances can be calculated and its argument used to pinpoint the fault position. However, since the fault impedance network is not solvable for the general case, the fault type needs to be identified so that one of the fault impedances can be calculated correctly.

Identifying the fault type involves determining the form of the fault point network. To do this a range of fault networks are assumed and the fault impedances, assumed to be involved, calculated. The actual form of the fault network is identified by the calculated fault impedances, involved, sharing the same assumed fault distance at which their arguments tend towards zero. This is basically the same idea as has been employed in the fault location, except it is now applied to fault type identification.

FIG. 7 illustrates this method of fault type identification, showing an actual fault point network, two assumed fault point networks, one correct the other incorrect, and the variation of the calculated fault impedance arguments with assumed fault distance for each assumed network.

I claim:

1. A method of locating the position of a fault on a power transmission line between first and second ends of the line and involving measurements taken at the first end of the line only, the method comprising the steps of:

(a) calculating the complex fault impedance at each of a plurality of assumed fault positions along the length of the line, the fault impedance at each assumed position being calculated utilizing:
  (i) a measurement before and after fault occurrence of the voltage and current at said first end of the line,
  (ii) assumed parameters of the line, taking into account a possible variation of said parameters from a section of the line extending between the first end and the assumed fault position to a section of the line extending between the assumed fault position and the second end, and
  (iii) an assumed source impedance of said second end of the line; and (b) by analyzing the variation of the complex fault impedance over said plurality of assumed fault positions, selecting as the actual fault position the assumed fault position of said plurality of assumed fault positions for which the argument of the complex fault impedance most closely equals zero.

2. A method according to claim 1 wherein said fault impedance at each said assumed position is calculated utilizing the equation:

$$Zf=(Vf+Vfss)/If,$$

where Zf is the fault impedance, Vf is the difference between the fault point voltage before and after fault occurrence, Vfss is the fault point voltage before fault occurrence, and If is the fault current, and where $$Vf = Ax \cdot VL - Bx \cdot IL$$

$$Vfss = Ax \cdot VLss - Bx \cdot ILss,$$

and $$If = -(Cx + [Cy \cdot ZsR + Dy] \cdot [Ay \cdot ZsR + By]^{-1} \cdot Ax) \cdot VL + (Dx + [Cy \cdot ZsR + Dy] \cdot [Ay \cdot ZsR + By]^{-1} \cdot Bx) \cdot IL,$$

where Ax, Bx, Cx and Dx are four parameters describing the two-port network representing the transmission line between said first end and the fault, Ay, By, Cy and Dy are four parameters describing the two-port network representing the transmission line between said second end and the fault, VL is the difference between the voltage at said first end before and after fault occurrence, IL is the difference between the current at said first end before and after fault occurrence, VLss is the voltage at said first end before fault occurrence, ILss is the current at said first end before fault occurrence, and ZsR is the impedance at said second end.

3. A method according to claim 2 wherein Ax=1, Bx=x.ZL, Cx=0, Dx=1, Ay=1, By=y. ZL, Cy=0, and Dy=1, where x is the distance to the fault from said first end, ZL is the transmission line impedance per unit length, and y=L−x, where L is the total transmission line length.

4. A method according to claim 1, wherein: said power transmission line is a multi-phase power transmission line; said step of calculating the complex fault impedance is carried out in respect of each complex impedance of each of a plurality of forms of fault network assumed to be at each of said plurality of assumed fault positions, each complex impedance of each network at each position being calculated utilizing said items (i), (ii) and (iii), said measurement in item (i) being carried out in respect of each phase of the line, said method further comprising the step of:

analyzing the variation of each complex impedance of each assumed fault network over said plurality of assumed fault positions to determine the assumed fault network for which the argument of each complex impedance most closely equals zero at the same assumed fault position of the plurality of assumed fault positions;

said step (b) then comprising selecting as the actual fault position that same assumed fault position.

5. A method of determining the form of impedance network at a fault on a multi-phase power transmission line between first and second ends of the line comprising the steps of:

(a) calculating the complex impedances of each of a plurality of assumed forms of fault impedance network at each of a plurality of assumed fault positions along the length of the line, each complex impedance of each network at each position being calculated utilizing:

(i) a measurement before and after fault occurrence in respect of each phase of the line of the voltage and current at said first end of the line, (ii) assumed parameters of the line, taking into account a possible variation of said parameters from a section of the line extending between the first end and the assumed fault position to a section of the line extending between the assumed fault position and the second end, and (iii) an assumed source impedance of said second end of the line;

(b) analyzing the variation of each complex impedance of each assumed fault network over said plurality of assumed fault positions to determine the assumed fault network for which the argument of each complex impedance most closely equals zero at the same assumed fault position of the plurality of assumed fault positions; and (c) selecting from said analysis the form of that determined assumed fault network as the form of the actual fault impedance network.

* * * * *